United States Patent
Zhou et al.

(10) Patent No.: US 11,962,299 B2
(45) Date of Patent: Apr. 16, 2024

(54) FRACTIONAL FREQUENCY DIVIDER, RADIO FREQUENCY TRANSCEIVER, AND METHOD OF CONFIGURING PHASE DELAY

(71) Applicant: Hangzhou Geo-chip Technology Co., Ltd., Hangzhou (CN)

(72) Inventors: Yanping Zhou, Hangzhou (CN); Ruili Wu, Hangzhou (CN); Chun Geik Tan, San Diego, CA (US)

(73) Assignee: Hangzhou Geo-chip Technology Co., Ltd., Hangzhou (CN)

( * ) Notice: Subject to any disclaimer, the term of this patent is extended or adjusted under 35 U.S.C. 154(b) by 0 days.

(21) Appl. No.: 18/364,867

(22) Filed: Aug. 3, 2023

(65) Prior Publication Data

US 2024/0063799 A1 Feb. 22, 2024

(30) Foreign Application Priority Data

Aug. 16, 2022 (CN) .......................... 202210983838.1

(51) Int. Cl.
*H03K 21/02* (2006.01)
*H03K 5/01* (2006.01)
*H03K 5/00* (2006.01)

(52) U.S. Cl.
CPC .............. *H03K 21/02* (2013.01); *H03K 5/01* (2013.01); *H03K 2005/00078* (2013.01)

(58) Field of Classification Search
CPC ...... H03K 21/02; H03K 21/026; H03K 21/08; H03K 21/10
USPC .......................................................... 327/117
See application file for complete search history.

(56) References Cited

U.S. PATENT DOCUMENTS 10,651,876 B1 * 5/2020 Perez ..................... H03L 7/1974
2020/0395961 A1 * 12/2020 Perez ...................... H03L 7/099
2021/0281254 A1 9/2021 Tiwari et al.

FOREIGN PATENT DOCUMENTS

CN 106549664 A 3/2017

OTHER PUBLICATIONS

Chinese First Office Action (with English translation) for corresponding CN Application No. 202210983838.1, dated Jan. 12, 2023, 11 pages.
Chinese Notice of Granting Invention Patent (w/ English translation) for corresponding CN Application No. 202210983838.1, dated Feb. 19, 2023, 2 pages.

* cited by examiner

*Primary Examiner* — William Hernandez
(74) *Attorney, Agent, or Firm* — Dority & Manning, PA

(57) ABSTRACT

The present disclosure relates to a fractional frequency divider, a radio frequency transceiver, and a method of configuring a phase delay in the fractional frequency divider. The fractional frequency divider comprises a counter, a multiplexer, and a delay module. The method is applicable to the fractional frequency divider. The radio frequency transceiver comprises the fractional frequency divider, and the fractional frequency divider adopts the method. According to the aforesaid technical solution, the present disclosure has advantages as follows: the embodiments of the present disclosure can minimize the timing inaccuracy and suppress the output jitter and output spurs; and the embodiments of the present disclosure can effectively extend the operating frequency range of the fractional frequency divider.

11 Claims, 5 Drawing Sheets

FRACTIONAL FREQUENCY DIVIDER, RADIO FREQUENCY TRANSCEIVER, AND METHOD OF CONFIGURING PHASE DELAY

CROSS-REFERENCE TO RELATED PATENT APPLICATION

This application claims the benefit of and priority to Chinese Patent Application No. 202210983838.1 filed on Aug. 16, 2022, the entire disclosure of which is incorporated by reference herein.

TECHNICAL FIELD

The present disclosure relates to the field of communication technologies, in particular to a fractional frequency divider, a radio frequency transceiver, and a method of configuring a phase delay in the fractional frequency divider.

BACKGROUND

Periodic clock signals may be provided by an oscillator such as a voltage controlled oscillator (VCO) in a wireless communication device for the wireless communication device to generate specified frequencies for data transmission in different frequency bands. The fractional frequency divider is a device that can generate various frequency bands and is used to prevent a power amplifier from posing harmonic pulling on a voltage-controlled oscillator.

The fractional frequency divider in the prior art not only has timing inaccuracy, but also has technical problems of output jitter and output spurs.

SUMMARY

One aspect of the present disclosure provides a fractional frequency divider to improve timing accuracy and solve the technical problems of output jitter and output spurs.

The fractional frequency divider may include a counter, a multiplexer, and a delay module. The multiplexer has signal control terminals of respectively connected to output terminals of the counter and configured to enable clock signals received at signal input terminals of the multiplexer to be transferred to a signal output terminal of the multiplexer, where the clock signals received at the signal input terminals have the same clock period and the same duty cycle; the delay module has a clock signal input terminal connected to the signal output terminal of the multiplexer and is configured to delay, in a steady state, a first clock signal received at the clock signal input terminal to output a second clock signal via a clock signal output terminal of the delay module; the counter has a clock signal input terminal connected to the clock signal output terminal of the delay module and is configured to perform cyclic count based on the second clock signal received at the clock signal input terminal of the counter; and the delay module includes a plurality of delay units and a driver connected in series and is configured to generate a signal selection window and perform calibration.

In some embodiments, the delay module may further include a control unit and a selection module that is connected in series between the plurality of delay units and the driver, where the selection module includes a switch unit and an inverter connected in parallel with each other, the switch unit and the inverter being controlled by the control unit, such that a clock signal within the delay module passes through only one selected from the switch unit and the inverter.

In some embodiments, the fractional frequency divider may further include a delay calibration module and a buffer module, where the delay calibration module is configured to determine a total delay produced by the delay module, and the buffer module is configured to receive the first clock signal and take the first clock signal as buffered as an output of the fractional frequency divider.

In some embodiments, the control unit is configured to send an enable control signal to the inverter to enable an operating state or a non-operating high impedance state of the inverter, and the control unit is configured to send a switch control signal to the switch unit to turn on or off the switch unit.

In some embodiments, among the output terminals of the counter, only one output terminal outputs a high level and the other output terminals output a low level at the same moment.

In some embodiments, for every two adjacent signal input terminals, based on an order in which the signal input terminals are selected by the multiplexer, a later selected signal input terminal receives a clock signal with a delay relative to the clock signal received by an earlier selected signal input terminal that is equal to a quotient obtained by dividing said clock period of the clock signals received at the signal input terminals by the number of the signal input terminals.

Another aspect of the present disclosure provides a method of configuring a phase delay in a fractional frequency divider. The method is applicable to the fractional frequency divider according to some embodiments of the present disclosure, and includes that: a ratio of a clock period of a clock signal output by a delay module of the frequency divider to a clock period of clock signals received by the signal input terminals of a multiplexer of the frequency divider is (1+1/N), where N refers to a number of the signal input terminals, and a clock signal received by a selected signal input terminal includes a low level section, a high level section and a low level section that are sequentially continuous;

any one rising edge is located in the intermediate time region between a first moment and a second moment;
the first moment is a waveform rising edge moment of the last selected signal input terminal for the signal input terminal selected within a clock cycle of the second clock signal that follows said any one rising edge of the second clock signal, the waveform rising edge moment coming after said any one rising edge; and
the second moment is a waveform falling edge moment of a first signal input terminal within a first clock cycle of the second clock signal, the waveform falling edge moment preceding the first rising edge.

In some embodiments, the N may be equal to 4.

In some embodiments, among the output terminals of the counter, only one output terminal outputs a high level and the other output terminals output a low level at the same moment.

In some embodiments, for every two adjacent signal input terminals, based on an order in which the signal input terminals are selected by the multiplexer, a later selected signal input terminal receives a clock signal with a delay relative to the clock signal received by an earlier selected signal input terminal that is equal to a quotient obtained by dividing said clock period of the clock signals received at the signal input terminals by the number of the signal input terminals.

In some embodiments, the delay module may further include a control unit and a selection module that is connected in series between the plurality of delay units and the driver, where the selection module includes a switch unit and an inverter connected in parallel with each other, the switch unit and the inverter being controlled by the control unit, such that a clock signal within the delay module passes through only one selected from the switch unit and the inverter.

In some embodiments, the fractional frequency divider may further include a delay calibration module and a buffer module, where the delay calibration module is configured to determine a total delay produced by the delay module, and the buffer module is configured to receive a first clock signal and take the first clock signal as buffered as an output of the fractional frequency divider.

In some embodiments, the control unit is configured to send an enable control signal to the inverter to enable an operating state or a non-operating high impedance state of the inverter, and the control unit is configured to send a switch control signal to the switch unit to turn on or off the switch unit.

Still another aspect of the present disclosure provides a radio frequency transceiver, which includes a fractional frequency divider according to some embodiments of the present disclosure, where the fractional frequency divider employs a method of configuring a phase delay in the fractional frequency divider according to some embodiments of the present disclosure.

By adopting aforesaid technical solutions, the present disclosure can achieve following advantages:
(1) the embodiments of the present disclosure can minimize the timing inaccuracy and suppress the output jitter and output spurs; and
(2) the embodiments of the present disclosure can effectively extend the operating frequency range of the fractional frequency divider.

The above summary is for illustrative purpose only and is not intended to suggest any limitation in any way. In addition to the illustrative aspects, embodiments, and features described above, further aspects, embodiments, and features of the present disclosure will be easily understood by referring to the accompanying drawings and the following detailed description.

BRIEF DESCRIPTION OF THE DRAWINGS

In the drawings, unless otherwise specified, the same reference sign refer to the same or similar component or element throughout the drawings, and the drawings are not necessarily drawn to scale. It should be understood that these drawings only depict some embodiments disclosed according to the present disclosure, and should not be regarded as limiting the scope of the present disclosure. The drawings means to facilitate understanding of the solution, and do not constitute a limitation to the present disclosure. In the drawings.

DETAILED DESCRIPTION

Figure 1:
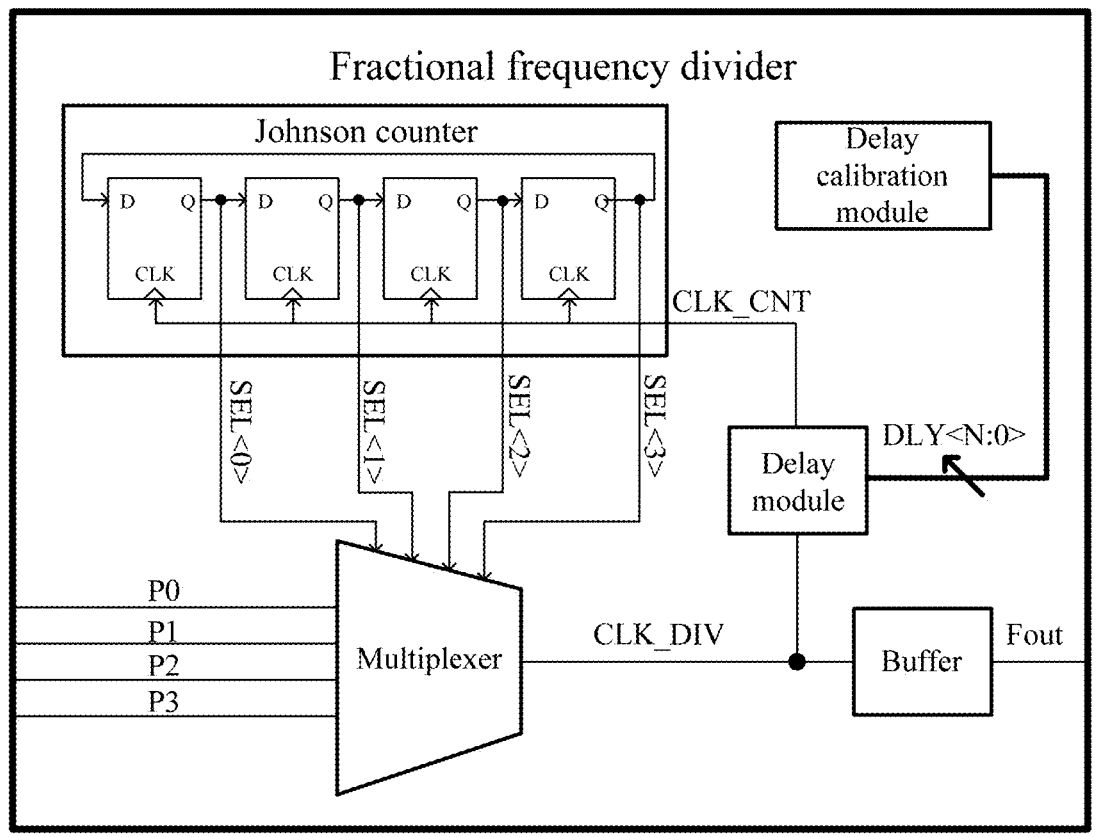
FIG. 1 is a schematic block diagram of a 4-phase divide-by-1.25 fractional frequency divider.

Only certain exemplary embodiments are briefly described hereinafter. As those skilled in the art would appreciate, the described embodiments may be modified in various different ways without departing from the spirit or scope of the present disclosure. Therefore, the drawings and description shall be regarded as exemplary in nature rather than restrictive.

In addition, the terms such as "first" and "second" are used for descriptive purposes only, and cannot be interpreted as indicating or implying relative importance or implicitly specifying the quantity of the indicated technical features. Hence, a feature defined by "first" and "second" can explicitly or implicitly include one or more of the features. In the description of the present disclosure, "plurality" refers to two or more, unless otherwise specifically defined.

In the present disclosure, unless otherwise specified and defined, the terms "install", "connect", "couple" and "fix" and the like should be understood in a broad sense. For example, these terms may refer to a fixed or detachable connection or being integrated; a mechanical, electrical or communication connection; a direct connection or an indirect connection through an intermediate medium; or a communication between interiors of two elements or the interaction between two elements. The specific meanings of the above terms in the present disclosure may be understood by those skilled in the art depending on the specific context.

The following disclosure provides many different embodiments or examples for illustrating the implementation of various structures of the present disclosure. In order to simplify the disclosure, the components and arrangements of specific examples are described below. Of course, they are merely illustrative, but not intended to limit the present disclosure. In addition, the same reference numerals and/or characters may be used throughout different examples in the present disclosure for the sake of simplification and clarity, but do not necessarily mean any relationship between the various embodiments and/or arrangements discussed. Furthermore, the present disclosure provides examples of various specific processes and materials, but the application of other processes and/or other materials may readily occur to those skilled in the art.

To prevent pulling of the power amplifier, a fractional frequency divider is adopted in a generation path of a local oscillator of a wireless transceiver. The prior art (e.g., "A 4.75-GHz Fractional Frequency Divider-by-1.25 With TDC-Based All-Digital Spur Calibration in 45-nm CMOS") proposes a phase-rotating fractional frequency divider that requires a delay cell to generate a signal selection window. FIG. 1 illustrates a schematic block diagram of a 4-phase divide-by-1.25 fractional frequency divider according to the prior art. As shown in FIG. 1, the fractional frequency divider includes a Johnson counter, a multiplexer, a delay module, a delay calibration module, and a buffer module. The fractional frequency divider may receive four clock signals P0, P1, P2 and P3 with different phases, and output a clock signal Fout with its clock period changed. In this example, the clock period of signal Fout is 1.25 times the clock period T of the clock signals P0, P1, P2 and P3, and is namely 1.25T.

The multiplexer has four signal input terminals configured to receive the clock signals P0, P1, P2, and P3. The phase difference between clock signals P0, P1, P2 and P3 is one quarter of the clock period (i.e. T/4). The clock signals P0, P1, P2 and P3 have the same frequency and duty cycle. In cases that signals in the fractional frequency divider are in a steady state, four signal control terminals of the multiplexer are configured to receive the four control signals SEL<0>, SEL<1>, SEL<2> and SEL<3> from the Johnson counter. The signal output terminal of the multiplexer outputs a clock signal CLK_DIV, which is then processed by the buffer to become the signal Fout. The signal CLK_DIV is also input to the clock signal input terminal of the delay module for delay processing.

The clock signal output terminal of the delay module outputs the delayed clock signal CLK_CNT to the clock signal input terminal of the counter. The total delay achievable by the delay module is controlled by the delay calibration module.

The Johnson counter outputs control signals SEL<0>, SEL<1>, SEL<2> and SEL<3> based on the clock signal CLK_CNT such that one of the four control signals is at a high level and the remaining control signals are at a low level for a certain time period, whereby only one selected from the signals P0, P1, P2 and P3 is enabled to pass through the multiplexer during that time period. For example, the signal P0 is enabled to pass through the multiplexer if the signal SEL<0> is at the high level.

Figure 2A:
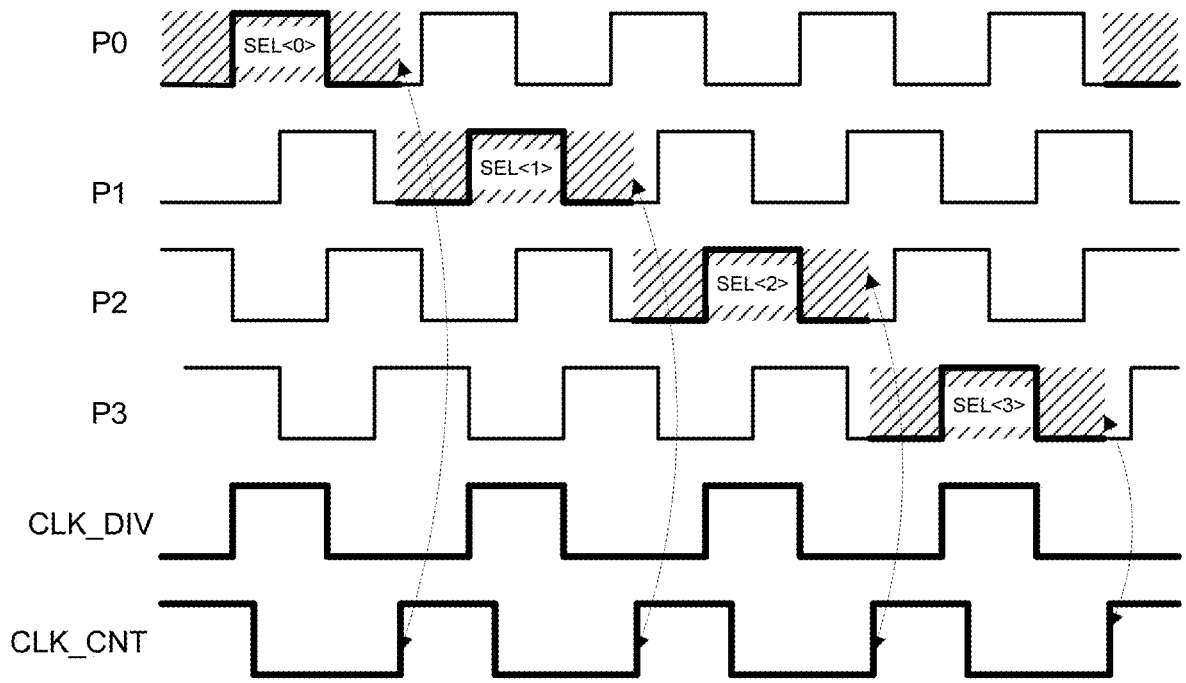
FIG. 2a and FIG. 2b are timing diagrams for individual clock signals within a 4-phase divide-by-1.25 fractional frequency divider.

FIG. 2a is a timing diagram for individual clock signals within the 4-phase divide-by-1.25 fractional frequency divider. As shown in FIG. 2a, the shadow regions in the figure indicate the time windows in which signals P0, P1, P2, and P3 are selected. The rising edge of signal CLK_CNT triggers the switching of control signals SEL<0>, SEL<1>, SEL<2> and SEL<3>, such that the signal segments captured from the signals P0, P1, P2 and P3, respectively, at different time windows can collectively form the clock signal CLK_DIV.

Figure 2B:
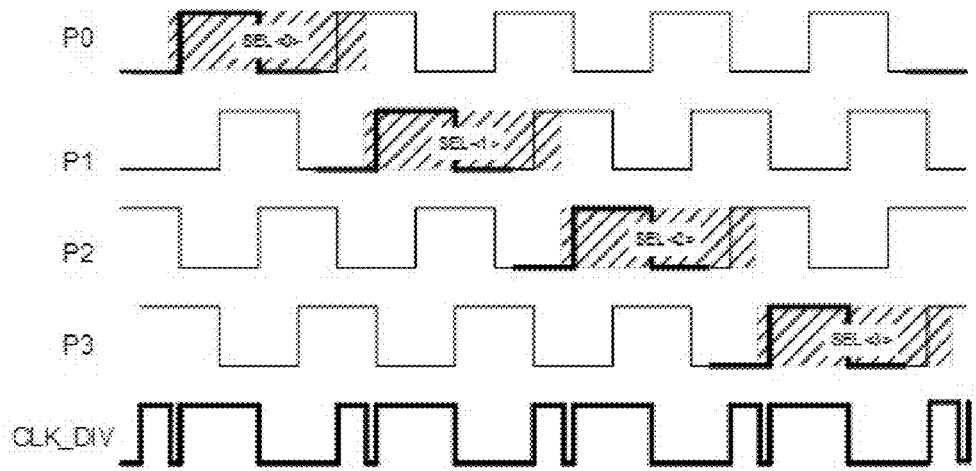

The selection windows generated by the control signals SEL<0>, SEL<1>, SEL<2> and SEL<3> must ensure that only one complete high level pulse is captured from P0, P1, P2 and P3 into the output signal. If the temporal phase relationship between the selected signals SEL<0>, SEL<1>, SEL<2> and SEL<3> and P0, P1, P2 and P3 fails to meet the expectation, more than one of the complete pulses may be captured from P0, P1, P2 and P3, which as shown in FIG. 2b may cause the clock signal CLK_DIV2 to undergo jitter and spurs.

Figure 3:
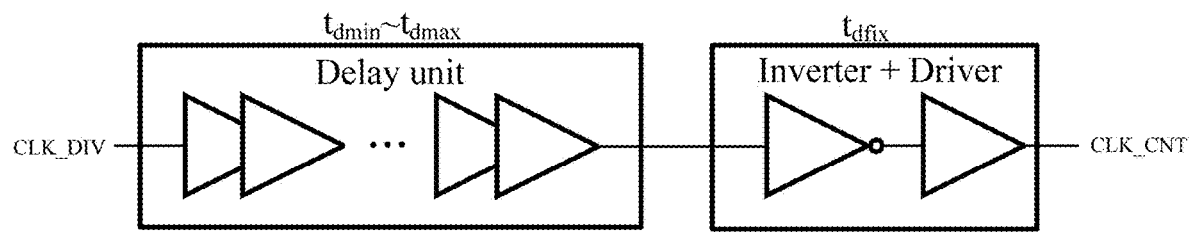
FIG. 3 is a schematic diagram of a delay module according to examples of the prior art.

FIG. 3 is a schematic diagram of a delay module. The delay module includes a first module consisting of a plurality of delay units and a second module consisting of an inverter and a driver. The delay calibration module is enabled to adjust the total delay produced by the delay module by determining whether any of the plurality of delay units within the first module is operating. The second module is connected in series with the first module.

Figure 4:
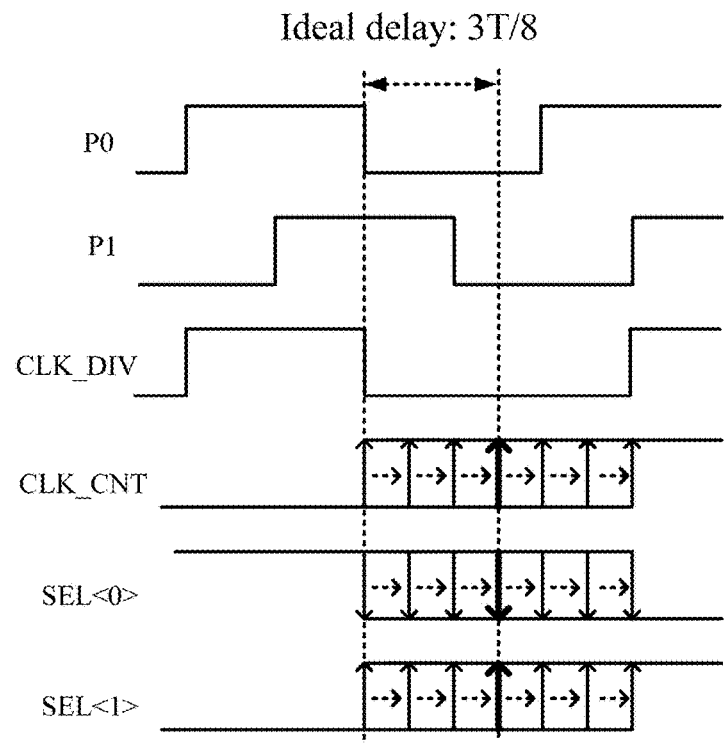
FIG. 4 shows details of a timing diagram implemented based on the delay module of FIG. 3.

FIG. 4 shows details of a timing diagram implemented based on the delay module of FIG. 3. Ideally, the delay module shown in FIG. 3 triggers the rising edge of signal CLK_CNT (see the bold arrow in signal CLK_CNT) three eighths of a cycle (i.e. 3T/8) after the first falling edge of signal P0. The rising edge of signal CLK_CNT triggers the falling edge of signal SEL<0> (see the bold arrow in signal SEL<0>) and the rising edge of signal SEL<1> (see the bold arrow in signal SEL<1>) via the counter. The rising edge of signal SEL<1> enables the multiplexer to select signal P1 as the output of the multiplexer. By analogy, in adjacent cycles, respective signal segments of signals P0, P1, P2 and P3 are sequentially selected to constitute the clock signal CLK_DIV Each signal segment includes two low level sections with each length of three-eighths of cycle and one high level section with a length of one-half of cycle. In this case, the length of the signal segment is equal to the length of the time window. The resulting clock signal CLK_DIV has a high level section with a length of one-half of cycle and a low level section with a length of three-quarters of cycle. That is, the clock period of signal CLK_DIV is 1.25T.

As shown in FIG. 3, the number of delay units in operating is adjustable, thus the minimum delay that can be achieved by the plurality of delay units is denoted as $t_{dmin}$, and the maximum delay that can be achieved by the plurality of delay units is denoted as $t_{dmax}$. The delay produced by the second module is fixed and thus is denoted as $t_{dfix}$. The actual delay produced by the second module consisting of the inverter and the driver can be expressed as $t_{dfix}$. Equations (1) and (2) below show the relationship between the frequency of the clock signal and the delay.

$$f_{div,max} = \frac{3}{\theta(t_{dmin} + t_{dfix})} \quad (1)$$

$$f_{div,min} = \frac{3}{\theta(t_{dmax} + t_{dfix})} \quad (2)$$

It can be derived from equations (1) and (2) that for the clock signals P0, P1, P2 and P3 received by the fractional frequency divider, the allowed minimum frequency is $f_{div,min}$, and the allowed maximum frequency is $f_{div,max}$.

As shown in FIG. 4, the signal CLK_DIV consists of a high level section and a low level section with a length of 3T/8 from signal P0 in the first time window, and a low level section with a length of 3T/8 of signal P1 in the second time window following the first time window. The rising edge of signal CLK_CNT is located at a moment right in the middle between the rising edge moment in a time window following the time window for signal P0 and the falling edge moment in a time window preceding the time window for signal P1. Any one rising edge of signal CLK_CNT may be located at a moment right in the middle between the rising edge moment of one of any two of signals P0, P1, P2, and P3 and the falling edge moment of the other one. However, in practice, each rising edge and each falling edge is not as steep as shown in the figures, but is slightly inclined to connect the high and low levels of the waveform. Thus, the rising edge of signal CLK_CNT is not always at the right-in-the-middle moment, but in the intermediate time region. The intermediate time region includes the right-in-the-middle moment and other moments that deviate from the right-in-the-middle moment. For example, the intermediate time region may deviate 0.01T to 0.1T from the right-in-the-middle moment.

First Embodiment of the Present Disclosure

Figure 5:
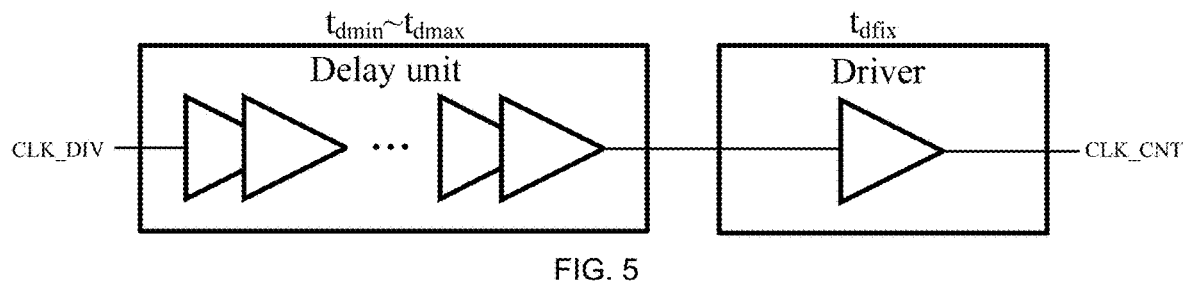
FIG. 5 is a schematic diagram of a delay module according to a first embodiment of the present disclosure.

FIG. 5 is a schematic diagram of a delay module according to the first embodiment of the present disclosure. The delay module includes a third module consisting of a plurality of delay units and a fourth module consisting of a driver. Comparing the delay module of FIG. 3 with that of FIG. 5, it can be seen that one of their differences lies in that the delay module of FIG. 3 further includes an inverter. In other words, compared to the prior art, the first embodiment of the present disclosure can overcome the shortcomings of the prior art by adding a suitable number of delay units and removing the inverter.

Specifically, the fractional frequency divider includes a counter, a multiplexer, and a delay module.

The multiplexer has signal control terminals respectively connected to output terminals of the counter and configured to enable clock signals received at signal input terminals of the multiplexer to be transferred to a signal output terminal of the multiplexer. The clock signals received at the signal input terminals have the same clock period and the same duty cycle.

The delay module has a clock signal input terminal connected to the signal output terminal of the multiplexer, and is configured to delay, in a steady state, the first clock signal received at the clock signal input terminal to output a second clock signal via a clock signal output terminal of the delay module.

The counter has a clock signal input terminal connected to the clock signal output terminal of the delay module, and is configured to perform cyclic count based on the second clock signal received at the clock signal input terminal of the counter.

The fractional frequency divider may further include a delay calibration module and a buffer module. The delay calibration module is configured to determine a total delay produced by the delay module, and the buffer module is configured to receive a first clock signal and take the first clock signal as buffered as an output of the fractional frequency divider.

Figure 6:
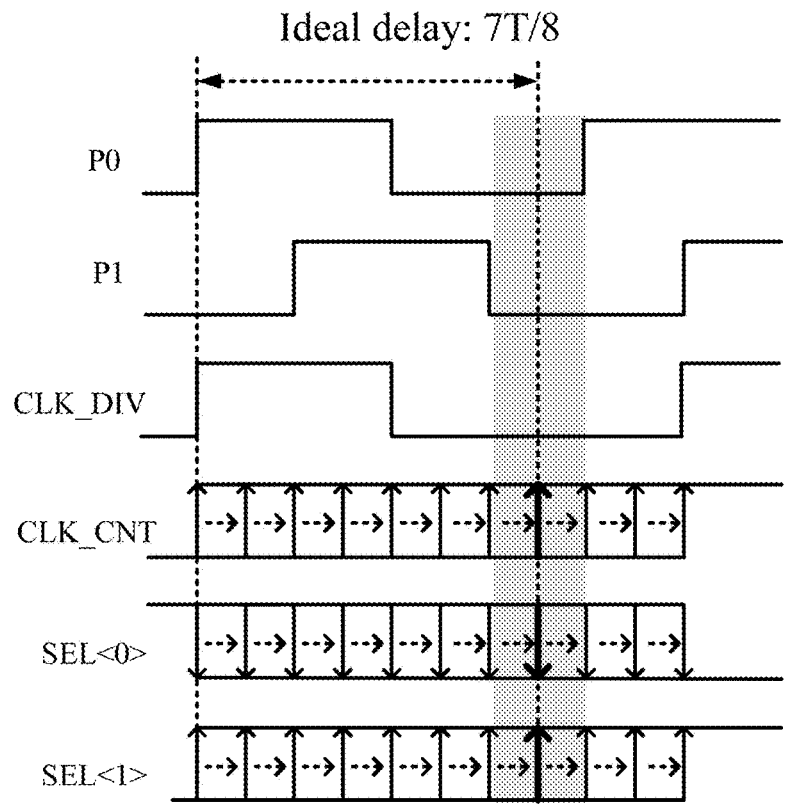
FIG. 6 shows details of a timing diagram implemented based on the delay module of FIG. 5.

FIG. 6 shows details of a timing diagram implemented based on the delay module of FIG. 5. Ideally, the delay module illustrated in FIG. 3 triggers the rising edge of signal CLK_CNT (see the bold arrow in signal CLK_CNT) seven eighths of cycle (i.e., 7T/8) after the first rising edge of signal P0. The rising edge of signal CLK_CNT triggers the falling edge of signal SEL<0> (see the bold arrow in signal SEL<0>) and the rising edge of signal SEL<1> (see the bold arrow in signal SEL<1>) via the counter. The rising edge of signal SEL<1> enables the multiplexer to select signal P1 as the output of the multiplexer. By analogy, in adjacent cycles, respective signal segments of signals P0, P1, P2 and P3 are sequentially selected to constitute the clock signal CLK_DIV Each signal segment includes two low level sections with a length of three-eighths of cycle and one high level section with a length of one-half cycle. In this case, the length of the signal segment is equal to the length of the time window. The resulting clock signal CLK_DIV has a high level section with a length of one-half of cycle and a low level section with a length of three-quarters of cycle. That is, the clock period of signal CLK_DIV is 1.25T.

In conjunction with FIG. 5, according to the present disclosure, for every two adjacent signal input terminals, based on an order in which the plurality of signal input terminals are selected by the multiplexer, a later selected signal input terminal receives a clock signal with a delay relative to the clock signal received by an earlier selected signal input terminal that is equal to a quotient obtained by dividing said clock period of the clock signals received at the signal input terminals by the number of the signal input terminals. The number of delay units in operating is adjustable, thus the minimum delay that can be achieved by the plurality of delay units is denoted as $t_{dmin}$, and the maximum delay that can be achieved by the plurality of delay units is denoted as $t_{dmax}$. The delay generated by the second module is fixed and thus is denoted as $t_{dfix}$. The actual delay generated by the second module including the driver can be expressed as $t_{dfix}$. Equations (3) and (4) below show the relationship between the frequency of the clock signal and the delay.

$$f_{div,max} = \frac{7}{\theta(t_{dmin} + t_{dfix})} \tag{3}$$

$$f_{div,min} = \frac{7}{\theta(t_{dmax} + t_{dfix})} \tag{4}$$

It can be seen from equations (3) and (4) that for the clock signals P0, P1, P2 and P3 received by the fractional frequency divider, the allowed minimum frequency is $f_{div,min}$, and the allowed maximum frequency is $f_{div,max}$.

The method of configuring a phase delay in the fractional frequency divider includes that:

a ratio of a clock period of a clock signal output by a delay module of the frequency divider to a clock period of clock signals received by the signal input terminals of a multiplexer of the frequency divider is (1+1/N), where N refers to a number of the signal input terminals, and a clock signal received by a selected signal input terminal includes a low level section, a high level section and a low level section that are sequentially continuous;

any one rising edge is located in an intermediate time region between a first moment and a second moment;

the first moment is a waveform rising edge moment of the last selected signal input terminal for a signal input terminal selected within a clock cycle of the second clock signal that follows said any one rising edge of the second clock signal, the waveform rising edge moment coming after the rising edge; and the second moment is a waveform falling edge moment of a first signal input terminal within a first clock cycle of the second clock signal, the waveform falling edge moment preceding a first rising edge.

As an example, FIG. 6 shows that the signal CLK_DIV consists of a high level section and a low level section with a length of 3T/8 from signal P0 in the first time window, and a low level section with a length of 3T/8 from signal P1 in the second time window following the first time window. The rising edge of signal CLK_CNT is located at a moment right in the middle between the rising edge moment in a time window following the time window for signal P0 and the falling edge moment in a time window preceding the time window for signal P1. Any one rising edge of signal CLK_CNT is located at a moment right in the middle between the rising edge moment of one of any two of signals P0, P1, P2, and P3 and the falling edge moment of the other one. However, in practice, each rising edge and each falling edge is not as steep as shown in the figures, but is slightly inclined to connect the high and low levels of the waveform. Thus, the rising edge of signal CLK_CNT is not always at the right-in-the-middle moment, but in an intermediate time region. The intermediate time region includes the right-in-the-middle moment and other moments that deviate from the right-in-the-middle moment. For example, the intermediate time region may deviate 0.01T to 0.1T from the right-in-the-middle moment.

In other words, compared to the prior art, the first embodiment of the present disclosure can overcome the existing problem to minimize the timing inaccuracy by adding a suitable number of delay units and removing the inverter.

Second Embodiment of the Present Disclosure

Figure 7:
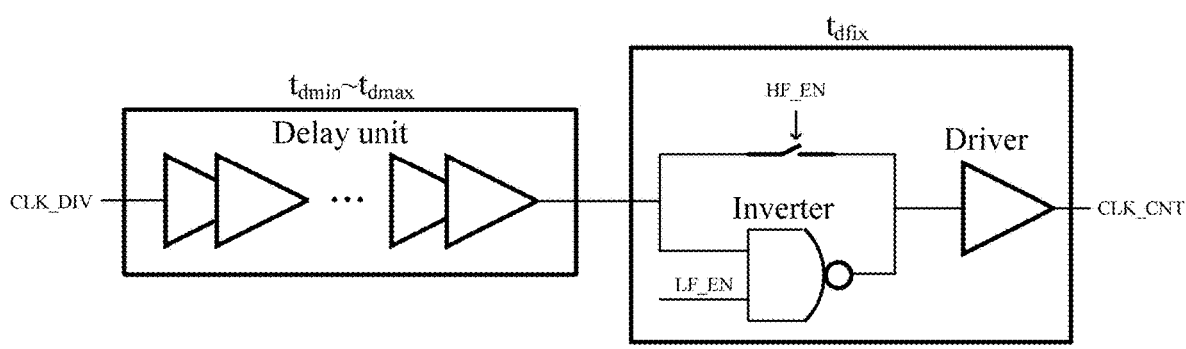
FIG. 7 is a schematic diagram of a delay module according to a second embodiment of the present disclosure.

FIG. 7 is a schematic diagram of a delay module according to a second embodiment of the present disclosure. The delay module includes a fifth module consisting of a plurality of delay units, a sixth module consisting of a switch unit, an inverter and a driver, and a control unit (not shown). A selection module connected in series between the plurality of delay units and the driver is further included, where the selection module includes a switch unit and an inverter connected in parallel with each other; the switch unit and the inverter being controlled by the control unit, such that a clock signal within the delay module passes through only one selected from the switch unit and the inverter.

The control unit is configured to send an enable control signal to the inverter to enable an operating state or a non-operating high impedance state of the inverter, and the control unit is configured to send a switch control signal to the switch unit to turn on or off the switch unit.

In addition, among a plurality of output terminals of the counter, only one output terminal outputs a high level and the other output terminals output a low level at the same moment.

The solution as shown in FIG. 7 combines the configurations of both the example and the first embodiment. The fifth module is connected in series with the sixth module. In the sixth module, the switching unit and the inverter are connected in parallel and the combination of the switching unit and the inverter is connected in series with the driver. The switch unit is controlled by signal HF_EN from the control unit to turn on or off the switch. One terminal of the inverter receives signal LF_EN from the control unit to enable an operating state or a non-operating (i.e., presenting a high impedance) state of the inverter.

Thus, the sixth module may have two operation modes. In the first operation mode, the switch unit is on and the inverter is inactive. In this case, the delay module shown in FIG. 7 corresponds to the delay module according to the first embodiment of the present disclosure. In the second operation mode, the switch unit is off and the inverter is in operation. In this case, the delay module shown in FIG. 7 corresponds to the delay module according to the example. Thus, the delay module shown in FIG. 7 may operate in the frequency range shown in equations (5) and (6).

$$f_{div,max} = \frac{7}{\theta(t_{dmin} + t_{dfix})} \quad (5)$$

$$f_{div,min} = \frac{3}{\theta(t_{dmax} + t_{dfix})} \quad (6)$$

$$f_{div,range} = \frac{f_{div,max} - f_{div,min}}{0.5(f_{div,max} + f_{div,min})} \quad (7)$$

It can be clearly seen from equations (5), (6) and (7) that the operating frequency range of the delay module shown in FIG. 7 far exceeds those of the delay module according to the example and the delay module according to the first embodiment. The aforesaid conclusions can be verified by actual data, referring to Table 1 as below.

| | Example | First embodiment | Second embodiment |
|---|---|---|---|
| $t_{dfix}$ (ps) | 120 | 120 | 120 |
| $t_{dmin}$ (ps) | 20 | 20 | 20 |
| $t_{dmax}$ (ps) | 220 | 220 | 220 |
| $f_{div,max}$ (GHz) | 2.68 | 6.25 | 6.25 |
| $f_{div,min}$ (GHz) | 1.10 | 2.57 | 1.10 |
| $f_{div,range}$ (%) | 83 | 83 | 140 |

As shown in Table 1, assuming that the actual delay caused by the second module, the fourth module and the sixth module are all 120 ps, and that the adjustable delays of the first module, the third module and the fifth module all range from 20 ps to 220 ps, then the operating frequency range of the second embodiment completely covers the operating frequency ranges of the example and the first embodiment. Specifically, the solution according to the example is suitable only for a relatively low operating frequency range, the solution according to the first embodiment is suitable for a relatively high operating frequency range, and the solution according to the second embodiment is suitable for an operating frequency range that covers both of the operating frequency ranges.

Thus, the second embodiment according to the present disclosure may extend the operating frequency range by selectively implementing solutions from the prior art and the first embodiment of the present disclosure.

FIGS. 8a to 8d show waveform simulation results derived based on the data of Table 1.

Figure 8A:
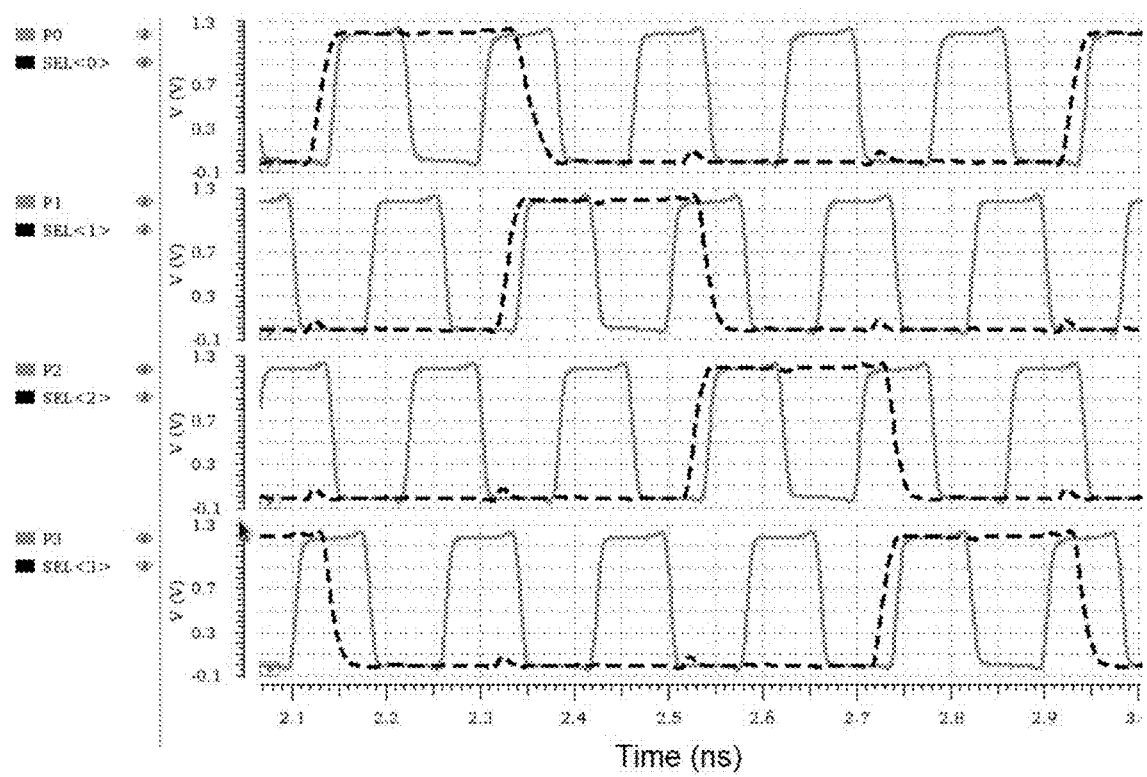
FIGS. 8a to 8d are waveform simulation results derived according to examples of the prior art, the first embodiment, and the second embodiment.

FIG. 8a shows the simulation result using an operating frequency of 6.25 GHzs for the example of the prior art. For example, in FIG. 8a, the high level section of each of SEL<0>, SEL<1>, SEL<2> and SEL<3> caused not only one complete high level pulse signal in corresponding one of P0, P1, P2 and P3 to be selected, that is, the jitter and spurs were also introduced.

Figure 8B:
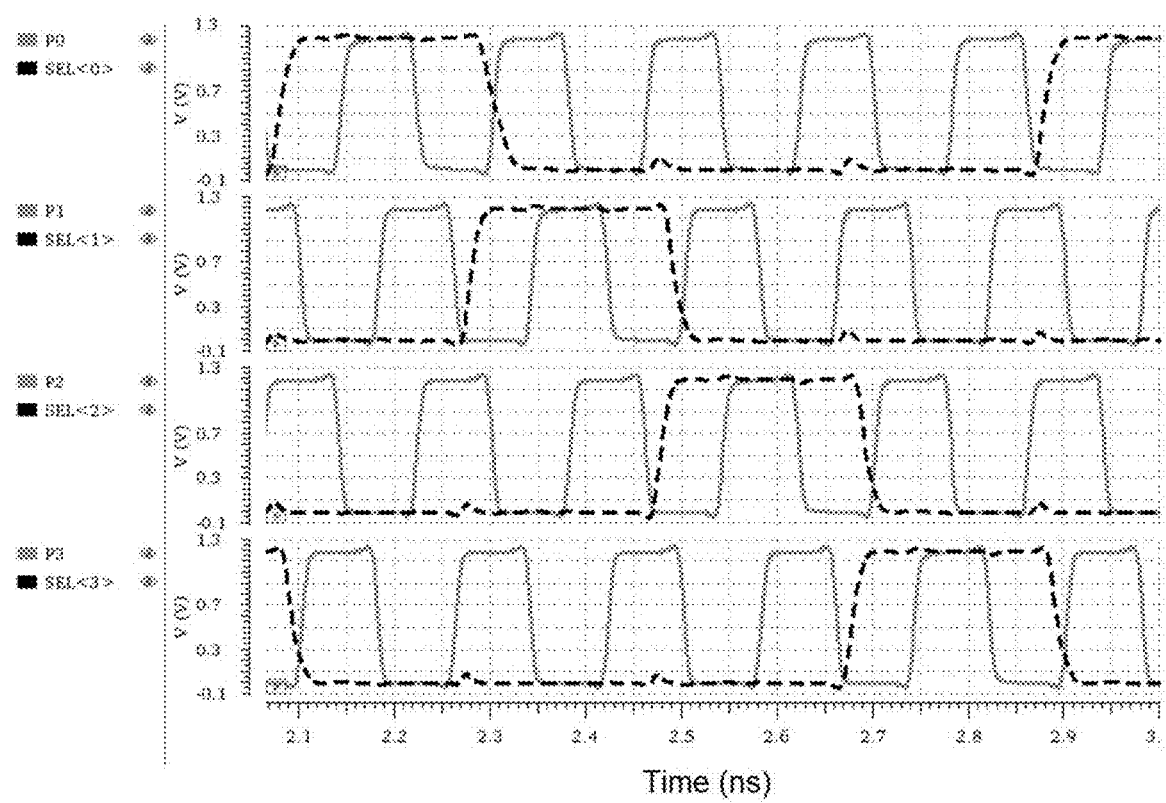

FIG. 8b shows the simulation result using an operating frequency of 6.25 GHz for the first and second embodiments. For example, in FIG. 8b, the high level section of each of SEL<0>, SEL<1>, SEL<2> and SEL<3> caused only one complete high level pulse signal in corresponding one of P0, P1, P2 and P3 to be selected, that is, the jitter and spurs were eliminated.

Figure 8C:
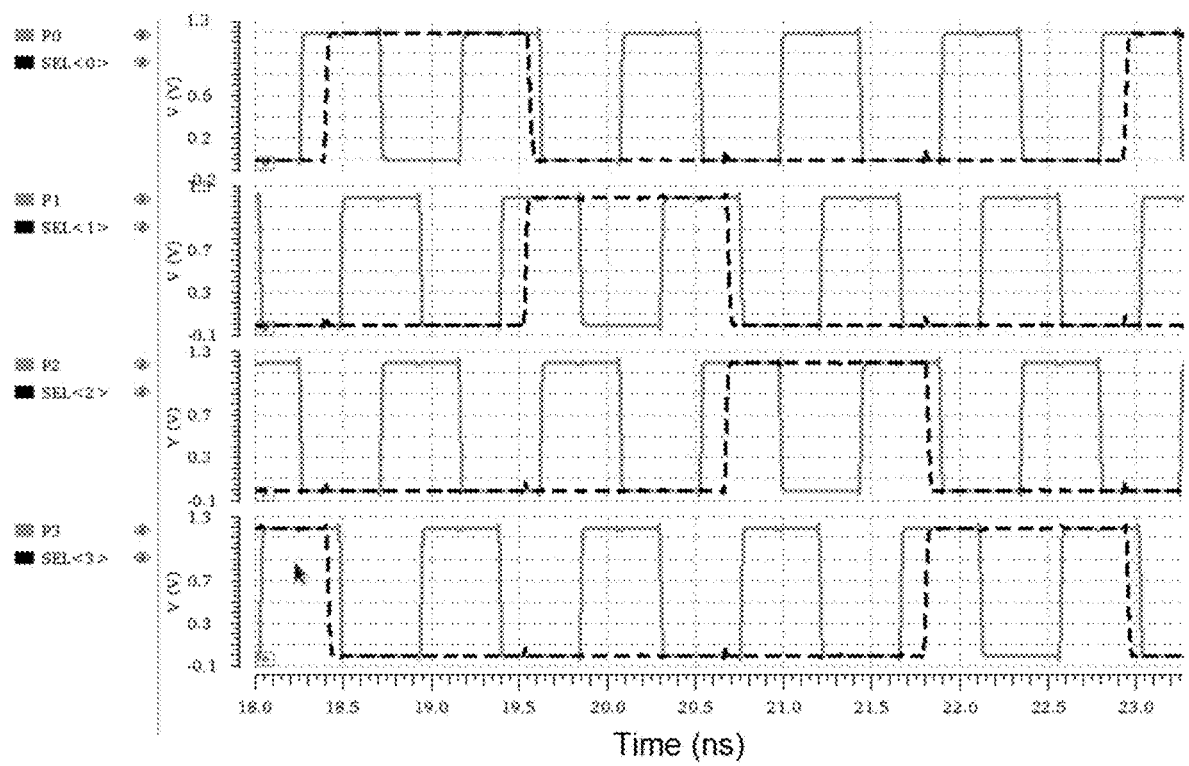

FIG. 8c shows the simulation result using an operating frequency of 1.1 GHz for the example of the prior art. For example, in FIG. 8c, the high level section of each of SEL<0>, SEL<1>, SEL<2> and SEL<3> caused not only one complete high level pulse signal in corresponding one of P0, P1, P2 and P3 to be selected, that is, the jitter and spurs were also introduced.

Figure 8D:
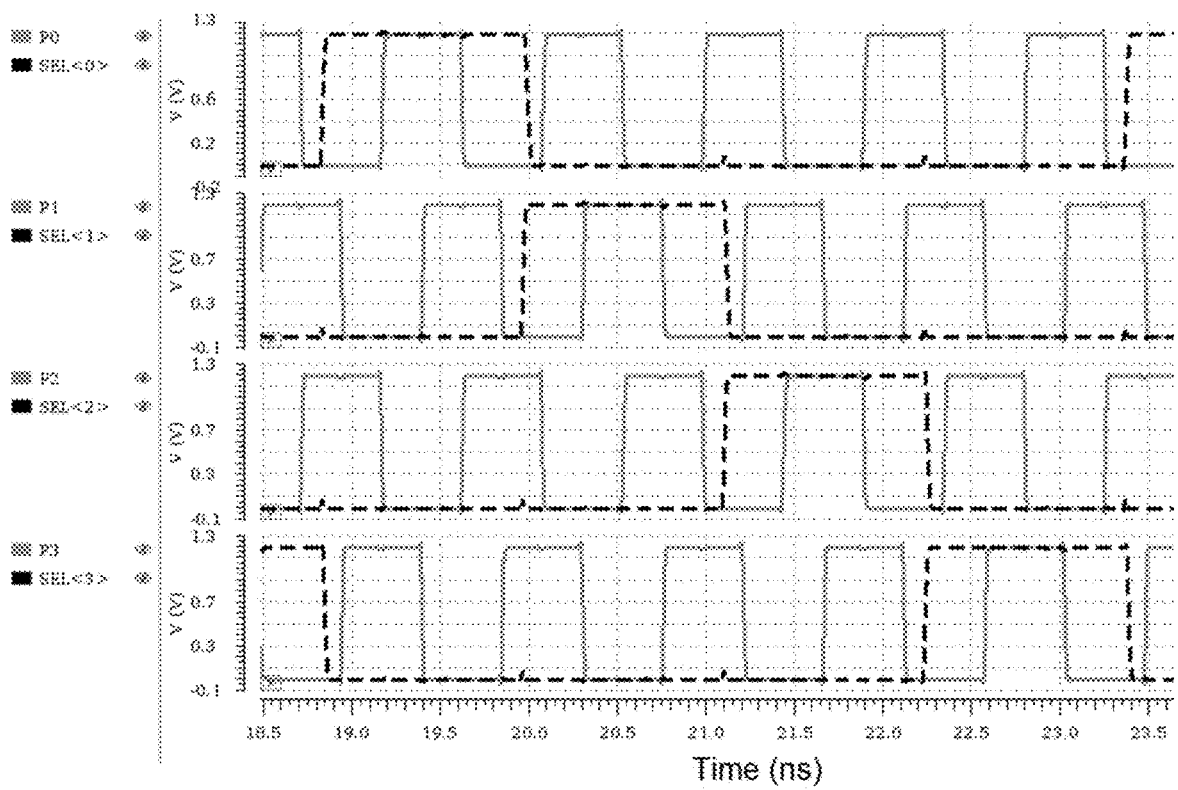

FIG. 8d shows the simulation result using an operating frequency of 1.1 GHz for the first and second embodiments. For example, in FIG. 8d, the high level section of each of SEL<0>, SEL<1>, SEL<2> and SEL<3> caused only one complete high level pulse signal in corresponding one of P0, P1, P2 and P3 to be selected, that is, the jitter and spurs were eliminated.

In view of the simulation results of FIG. 8a to FIG. 8d, according to embodiments of the present disclosure, the high level section of each of SEL<0>, SEL<1>, SEL<2> and SEL<3> causes only one complete high level pulse signal in corresponding one of P0, P1, P2 and P3 to be selected, such that the problem of not only one complete pulse caused to be selected in the prior art is overcome, thus eliminating the jitter and spurs.

In summary, according to aforesaid technical solutions, the present disclosure can achieve following advantages:
(1) the embodiments of the present disclosure can minimize the timing inaccuracy and suppress the output jitter and output spurs; and
(2) the embodiments of the present disclosure can effectively extend the operating frequency range of the fractional frequency divider.

The aforesaid embodiments do not constitute a limitation on the protection scope of the present disclosure. Those skilled in the art shall understand that various modifications, combinations, sub-combinations and substitutions may be made according to design requirements and other factors. The modification, equivalent replacement, improvement, or the like made according to the spirit and principle of the present disclosure shall be regarded as within the protection scope of the present disclosure.

What is claimed is:

1. A fractional frequency divider, comprising a counter, a multiplexer, and a delay module, wherein
    the multiplexer has signal control terminals respectively connected to output terminals of the counter and configured to enable clock signals received at signal input terminals of the multiplexer to be transferred to a signal output terminal of the multiplexer, the clock signals received at the signal input terminals having the same clock period and the same duty cycle;
    the delay module has a clock signal input terminal connected to the signal output terminal of the multiplexer, and is configured to delay, in a steady state, a first clock signal received at the clock signal input terminal to output a second clock signal via a clock signal output terminal of the delay module;
    the counter has a clock signal input terminal connected to the clock signal output terminal of the delay module, and is configured to perform cyclic count based on the second clock signal received at the clock signal input terminal of the counter; and
    the delay module comprises a plurality of delay units and a driver connected in series, and is configured to generate a signal selection window and perform calibration.

2. The fractional frequency divider according to claim 1, wherein the delay module further comprises a control unit and a selection module that is connected in series between the plurality of delay units and the driver, the selection module comprising a switch unit and an inverter connected in parallel with each other, wherein the switch unit and the inverter are controlled by the control unit, such that the clock signal within the delay module passes through only one selected from the switch unit and the inverter.

3. The fractional frequency divider according to claim 2, wherein the control unit is configured to send an enable control signal to the inverter to enable an operating state or a non-operating high impedance state of the inverter, and the control unit is configured to send a switch control signal to the switch unit to turn on or off the switch unit.

4. The fractional frequency divider according to claim 1, further comprising a delay calibration module and a buffer module, wherein the delay calibration module is configured to determine a total delay produced by the delay module, and the buffer module is configured to receive the first clock signal and take the first clock signal as buffered as an output of the fractional frequency divider.

5. The fractional frequency divider according to claim 1, wherein among the output terminals of the counter, only one outputs a high level and the other output terminals output a low level at the same moment.

6. The fractional frequency divider according to claim 1, wherein for every two adjacent signal input terminals, based on an order in which the signal input terminals are selected by the multiplexer, a later selected signal input terminal receives a clock signal with a delay relative to the clock signal received by an earlier selected signal input terminal that is equal to a quotient obtained by dividing said clock period of the clock signals received at the signal input terminals by the number of the signal input terminals.

7. A method of configuring a phase delay in a fractional frequency divider, applicable to the fractional frequency divider according to claim 1, the method comprising that:
    a ratio of a clock period of a clock signal output by a delay module of the fractional frequency divider to a clock period of clock signals received by signal input terminals of a multiplexer of the frequency divider is (1+1/N), wherein N refers to the number of the signal input terminals, and a clock signal received by a selected signal input terminal comprises a low level section, a high level section and a low level section that are sequentially continuous;
    any one rising edge is located in an intermediate time region between a first moment and a second moment;
    the first moment is a waveform rising edge moment of last selected signal input terminal for a signal input terminal selected within a clock period of the second clock signal that follows said any one rising edge of the second clock signal, the waveform rising edge moment coming after said any one rising edge; and
    the second moment is a waveform falling edge moment of a first signal input terminal within a first clock period of the second clock signal, the waveform falling edge moment preceding a first rising edge.

8. A method according to claim 7, wherein the N is equal to 4.

9. The method according to claim 7, wherein among the output terminals of the counter, only one output terminal outputs a high level and the other output terminals output a low level at the same moment.

10. The method according to claim 7, wherein for every two adjacent signal input terminals, based on an order in which the signal input terminals are selected by the multiplexer, a later selected signal input terminal receives a clock signal with a delay relative to the clock signal received by an earlier selected signal input terminal that is equal to a quotient obtained by dividing said clock period of the clock signals received at the signal input terminals by the number of the signal input terminals.

11. A radio frequency transceiver, comprising a fractional frequency divider, the fractional frequency divider comprising a counter, a multiplexer, and a delay module, wherein the multiplexer has signal control terminals respectively connected to output terminals of the counter and configured to enable clock signals received at signal input terminals of the multiplexer to be transferred to a signal output terminal of the multiplexer, the clock signals received at the signal input terminals having the same clock period and the same duty cycle; the delay module has a clock signal input terminal connected to the signal output terminal of the multiplexer, and is configured to delay, in a steady state, a first clock signal received at the clock signal input terminal to output a second clock signal via a clock signal output terminal of the delay module; the counter has a clock signal input terminal connected to the clock signal output terminal of the delay module, and is configured to perform cyclic count based on the second clock signal received at the clock signal input terminal of the counter; and the delay module comprises a plurality of delay units and a driver connected in series, and is configured to generate a signal selection window and perform calibration; and wherein the fractional frequency divider employs a method of configuring a phase delay in the fractional frequency divider according to claim 7.

* * * * *